United States Patent
Adachi et al.

(10) Patent No.: US 9,270,060 B2
(45) Date of Patent: Feb. 23, 2016

(54) SHIELD TERMINAL CONNECTION STRUCTURE AND METHOD

(75) Inventors: Hideomi Adachi, Kosai (JP); Hidehiko Kuboshima, Kosai (JP)

(73) Assignee: Yazaki Corporation, Tokyo (JP)

(*) Notice: Subject to any disclaimer, the term of this patent is extended or adjusted under 35 U.S.C. 154(b) by 108 days.

(21) Appl. No.: 13/702,778

(22) PCT Filed: Jun. 9, 2011

(86) PCT No.: PCT/JP2011/063295
§ 371 (c)(1),
(2), (4) Date: Dec. 7, 2012

(87) PCT Pub. No.: WO2011/155580
PCT Pub. Date: Dec. 15, 2011

(65) Prior Publication Data
US 2013/0084743 A1 Apr. 4, 2013

(30) Foreign Application Priority Data
Jun. 10, 2010 (JP) .................... 2010-132587

(51) Int. Cl.
*H01R 13/00* (2006.01)
*H01R 13/6596* (2011.01)
(Continued)

(52) U.S. Cl.
CPC .......... *H01R 13/6596* (2013.01); *H05K 9/0018* (2013.01); *H01R 9/18* (2013.01)

(58) Field of Classification Search
CPC .................................. H01R 13/6596
USPC ....................................... 174/359
See application file for complete search history.

(56) References Cited

U.S. PATENT DOCUMENTS 4,280,749 A * 7/1981 Hemmer ................ H01R 24/40
174/89
4,719,315 A * 1/1988 Gregorac ................. H01R 9/05
174/73.1
(Continued)

FOREIGN PATENT DOCUMENTS

CN 101437388 A 5/2009
JP 1130287 U 9/1989
(Continued)

OTHER PUBLICATIONS

International Search Report dated Jul. 12, 2011 from the International Searching Authority in counterpart application No. PCT/JP2011/063295.

(Continued)

*Primary Examiner* — Courtney Smith
*Assistant Examiner* — Rashen E Morrison
(74) *Attorney, Agent, or Firm* — Sughrue Mion, PLLC

(57) ABSTRACT

Provided is a shield terminal connection structure and method, which are easy and simple, for connecting a terminal part of a tubular shielding member to a shield structure. A terminal part of a shielding member is inserted to the outside of a tubular part of a shield casing, and then, when a pair of fixing parts, which are placed on a bolt fastening base, are clamped and fixed with a bolt, the terminal part of the shielding member is pressed with the fixing so that a terminal pressing part of a clamping and fixing member is in a surface contact with the tubular part. Therefore, at the same time of clamping and fixing with the bolt, electric connection of the shielding member is also completed.

8 Claims, 6 Drawing Sheets

(51) Int. Cl.
*H05K 9/00* (2006.01)
*H01R 9/18* (2006.01)

(56) References Cited

U.S. PATENT DOCUMENTS

| | | | | |
|---|---|---|---|---|
| 5,468,911 | A * | 11/1995 | Leve | H01R 4/646 |
| | | | | 174/73.1 |
| 5,866,843 | A | 2/1999 | Ikeda | |
| 6,085,416 | A | 7/2000 | Ikeda | |
| 6,583,352 | B2 * | 6/2003 | Fukushima | H01R 9/032 |
| | | | | 174/373 |
| 6,674,005 | B2 | 1/2004 | Yagi et al. | |
| 6,680,433 | B2 * | 1/2004 | Hashizawa | H01R 13/521 |
| | | | | 174/359 |
| 6,781,059 | B2 * | 8/2004 | Mizutani | H01R 13/6592 |
| | | | | 174/75 C |
| 6,815,610 | B2 * | 11/2004 | Kuboshima | H01R 9/032 |
| | | | | 174/360 |
| 6,864,426 | B2 * | 3/2005 | Miyazaki | H01R 13/655 |
| | | | | 174/75 C |
| 6,921,292 | B2 * | 7/2005 | Miyazaki | H01R 9/032 |
| | | | | 439/564 |
| 7,041,907 | B2 * | 5/2006 | Miyazaki | H01R 13/6592 |
| | | | | 174/359 |
| 7,094,970 | B2 * | 8/2006 | Kihira | B60L 11/1803 |
| | | | | 174/74 R |
| 7,331,823 | B2 * | 2/2008 | Fukushima | H01R 9/032 |
| | | | | 439/607.46 |
| 7,614,910 | B2 * | 11/2009 | Croteau | H01R 13/512 |
| | | | | 439/559 |
| 8,013,249 | B2 * | 9/2011 | Watanabe | H01B 7/16 |
| | | | | 174/102 R |
| 8,172,601 | B2 * | 5/2012 | Adachi | H02G 3/0437 |
| | | | | 385/60 |
| 8,395,047 | B2 * | 3/2013 | Adachi | B60L 3/0007 |
| | | | | 174/74 R |
| 8,672,700 | B2 * | 3/2014 | Matsumoto | H01M 2/20 |
| | | | | 439/364 |
| 2002/0134565 | A1 | 9/2002 | Hashizawa et al. | |
| 2003/0062177 | A1 | 4/2003 | Yagi et al. | |
| 2004/0099427 | A1 | 5/2004 | Kihira | |
| 2004/0144557 | A1 * | 7/2004 | Miyazaki | H01R 13/6592 |
| | | | | 174/72 A |
| 2005/0266729 | A1 * | 12/2005 | Fukushima | H01R 9/032 |
| | | | | 439/607.46 |
| 2009/0126985 | A1 | 5/2009 | Aoki et al. | |
| 2013/0084743 | A1 * | 4/2013 | Adachi | H05K 9/0018 |
| | | | | 439/607.28 |

FOREIGN PATENT DOCUMENTS

| | | |
|---|---|---|
| JP | 07-231192 A | 8/1995 |
| JP | 09-308042 A | 11/1997 |
| JP | 2003115223 A | 4/2003 |
| JP | 2004171952 A | 6/2004 |
| JP | 2005-240857 A | 9/2005 |
| JP | 2010140757 A | 6/2010 |

OTHER PUBLICATIONS

Written Opinion dated Jul. 12, 2011 from the International Searching Authority in counterpart application No. PCT/JP2011/063295.
Office Action dated Feb. 18, 2014, issued by the Japanese Patent Office in counterpart Japanese Patent Application No. 2010-132587.
Search Report dated Sep. 20, 2013, issued by the European Patent Office in counterpart European Application No. 11792537.0.
Office Action dated Sep. 4, 2014 issued by the State Intellectual Property Office of the People's Republic of China in counterpart Chinese Patent Application No. 201180028552.8.

* cited by examiner

SHIELD TERMINAL CONNECTION STRUCTURE AND METHOD

TECHNICAL FIELD

The present invention relates to a shield terminal connection structure and a shield terminal connecting method for connecting a terminal part of a tubular shielding member, which accommodates a plurality of conduction paths collectively, to a shield structure.

BACKGROUND ART

It is known that, in an electric vehicle or a hybrid vehicle, electromagnetic waves will occur from electric wires of a large current and a high voltage which are connected to a mounted motor. Therefore, it is important to take electromagnetic wave shielding measures which can prevent the influence of the electromagnetic waves and also can prevent the influence of electromagnetic waves from outside. Patent Literature 1 discloses an example of the electromagnetic wave shielding measures. Next, the electromagnetic wave shielding measure is described.

In FIG. 6, a reference numeral 1 shows a braid (shielding member) which is formed in a tubular shape by braiding conductive metal wires. A plurality of electric wires 2 are inserted into the inside of the braid 1. The plurality of electric wires 2 are collectively covered with the braid 1. The plurality of electric wires 2, for example, are inserted into a hole 4 which is formed in a shield casing 3 (shield structure) of a motor. The shield casing 3 is a metal casing member which has conductivity. A shielding shell 5 has conductivity, and is fixed to the shield casing 3. A terminal part of the braid 1 and the shielding shell 5 are fixed when a crimp ring 6 is crimped.

CITATION LIST

Patent Literature

Patent Literature 1: JP-A-2003-115223

SUMMARY OF INVENTION

Technical Problem

The terminal part of the braid 1 is inserted into a predetermined position of the shielding shell 5, and is pressed against the shielding shell 5 when the crimp ring 6 is crimped. Then, by fixing the shielding shell 5 to the shield casing 3, the braid 1 is electrically connected to the shield casing 3. Therefore, in the connecting of the braid 1, there is a problem that the connecting is time-consuming, and there is a problem that the number of components is large.

The present invention is made in view of the above-mentioned situations, and an object of the invention is to provide a shield terminal connection structure and a shield terminal connecting method, which are easy and simple, for connecting a terminal part of a tubular shielding member to a shield structure.

Solution to Problem

The above problem found in the present invention is solved with the following configurations.

(1) A shield terminal connection structure, including: a terminal part of a tubular shielding member which accommodates a plurality of conduction paths collectively, the terminal part itself forming a holding part; and a clamping and fixing member which is held to the holding part and includes a fixing part and a terminal pressing part which are integrally formed with each other, wherein the fixing part is provided for being fixed with a shield structure of a connection party to which the conduction paths are connected, and the terminal pressing part presses the holding part corresponding to the terminal part to the shield structure in accordance with fixing to the shield structure with the fixing part.

(2) The shield terminal connection structure according to the configuration (1), wherein a pressing surface which presses the holding part by surface contact is formed in the terminal pressing part.

(3) The shield terminal connection structure according to the configuration (1) or (2), wherein the holding part is formed by bending the terminal part in an axial direction of the shielding member, and the clamping and fixing member is held so that the fixing part is protruded outwards from the inside of the holding part.

(4) The shield terminal connection structure according to the configuration (3), wherein the terminal part is bent inwards.

(5) The shield terminal connection structure according to the configuration (3) or (4), wherein the holding part is formed by bending the terminal part in a generally bag-like shape and fixing the terminal part so that a bag mouth part of the generally bag-like shape is partly or totally closed.

(6) A shield terminal connection method, including: holding a clamping and fixing member to a terminal part of a tubular shielding member which accommodates a plurality of conduction paths collectively, and then, fixing the clamping and fixing member to a shield structure of a connection party to which the conduction paths are connected, via a fixing part of the clamping and fixing member, and pressing the terminal part to the shield structure by a terminal pressing part of the clamping and fixing member.

According to the shield terminal connection structure of the above configuration (1), what is necessary is just to use the clamping and fixing member, when the terminal part of the shielding member is connected to the shield structure. When the fixing part of the clamping and fixing member is fixed to the shield structure, the terminal part of the shielding member is pressed to the shield structure by the terminal pressing part of the clamping and fixing member with this fixing. Thus, an effect is achieved that a simple shield terminal connection structure for connecting the terminal part of the shielding member to the shield structure can be provided.

According to the shield terminal connection structure of the above configuration (2), the terminal part of the shielding member is pressed to contact in a surface. Thus, in addition to the effect of the above configuration (1), an effect is achieved that a stable connection can be obtained.

According to the shield terminal connection structure of the above configuration (3), since the fixing part of the clamping and fixing member is protruded to the outside of the shielding member, it is easy to fix to the shield structure. The fixing way may include bolt fastening, which is mentioned as a preferable example. Thus, in addition to the effects of the above configurations (1) or (2), an effect is achieved that the holding part can be simply formed.

According to the shield terminal connection structure of the above configuration (4), when the holding part is formed at the terminal part, if the terminal part is bent inwards, the terminal part of the shielding member is finished with a cut state, for example. That is, additional processes are not required particularly. Thus, in addition to the effect of the above configuration (3), an effect is achieved that it is not necessary to perform additional processes on the terminal of the shielding member.

According to the shield terminal connection structure of the above configuration (5), the clamping and fixing member is reliably held. The closing ways of the bag mouth part may include welding such as seam welding or spot welding, contact bonding such as heat contact bonding, and the use of closing members such as a stapler or a tape, which are mentioned as main examples. Thus, in addition to the effects of the above configurations (3) or (4), an effect is achieved that the clamping and fixing member can be reliably held.

According to the shield terminal connection method of the above configuration (6), an effect is achieved that a simple shield terminal connection method for connecting the terminal part of the shielding member to the shield structure can be provided.

MODES FOR CARRYING OUT INVENTION

A shield terminal connection structure and method according to one embodiment of the invention is a shield terminal connection structure and method in which a clamping and fixing member is fixed to a shield structure, and a terminal part of a shielding member is pressed against the shield structure in accordance with the fixing.

First Embodiment

Figure 1:
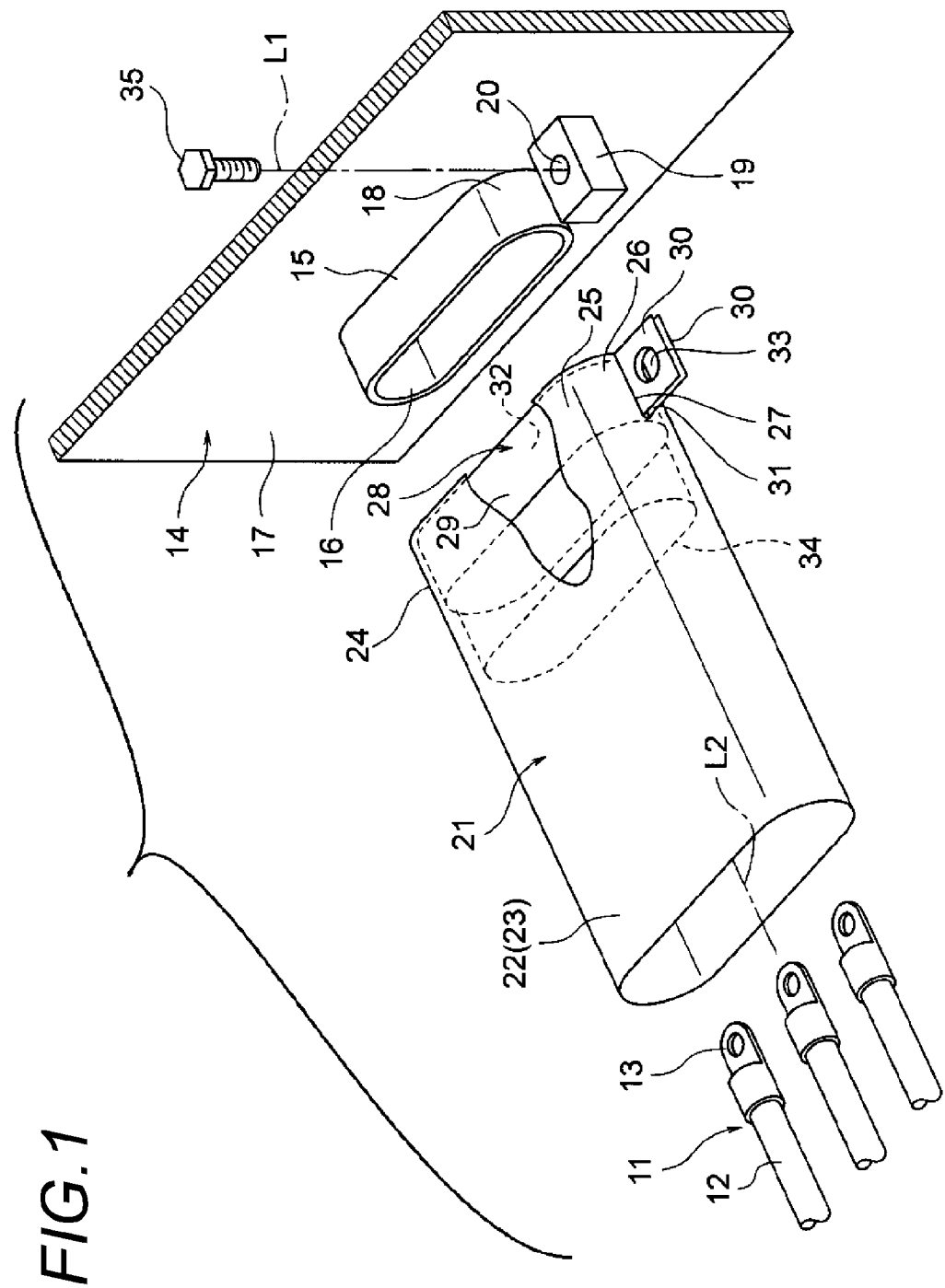
FIG. 1 is a diagram which shows a shield terminal connection structure according to the present invention, and is an exploded perspective view of a terminal part of a shielding member and a shield casing (shield structure) (a first embodiment).
Figure 2:
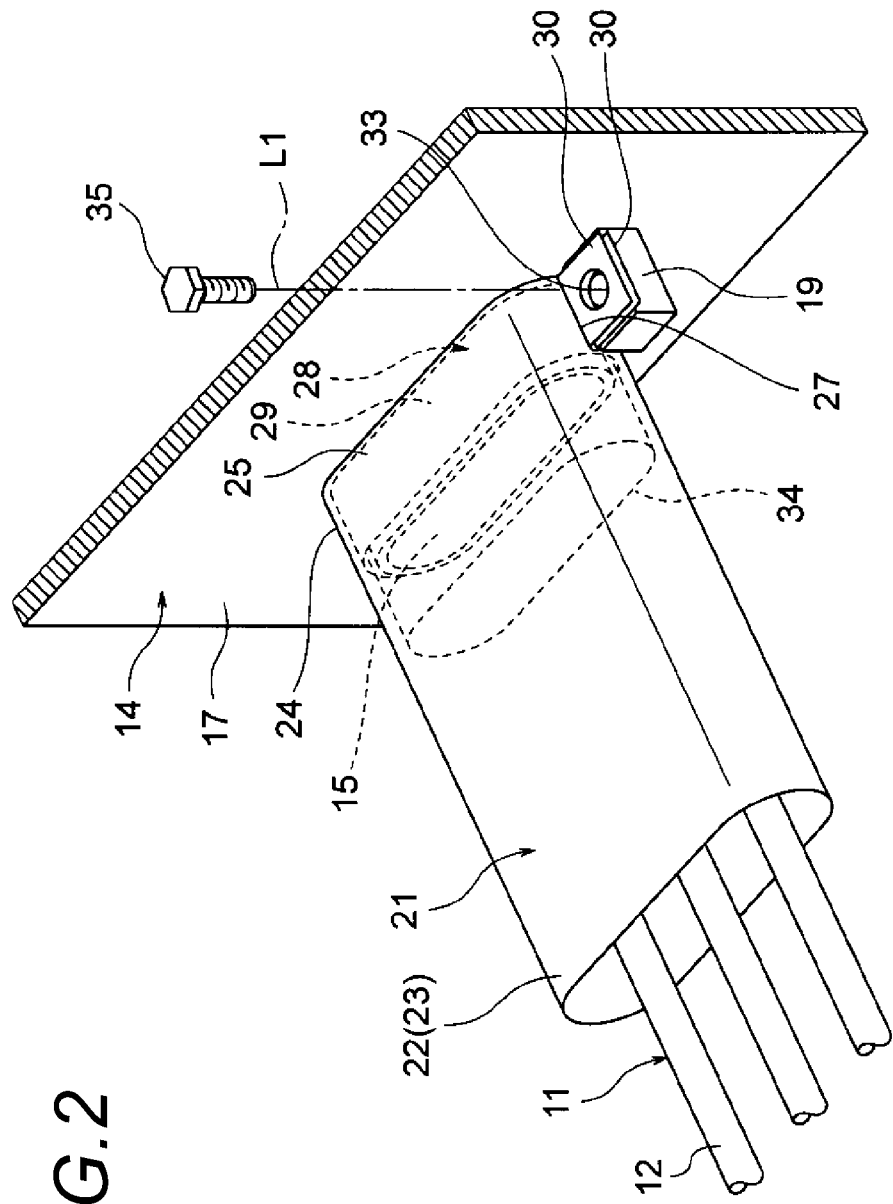
FIG. 2 is a perspective view which shows that the terminal part of the shielding member is being connected to the shield casing.

Next, a first embodiment is described with reference to the figures. FIG. 1 is a diagram which shows a shield terminal connection structure according to the present invention, and is an exploded perspective view of a terminal part of a shielding member and a shield casing. FIG. 2 is a perspective view which shows that the terminal part of the shielding member is being connected to the shield casing, and FIGS. 3(a) to 4(e) are diagrams which show the processes of forming a holding part at the terminal part of the shielding member and holding a clamping and fixing member. First, component members are described.

In FIG. 1, a reference numeral 11 indicates a high voltage conduction path. The conduction path 11 is not particularly limited, but is provided in order to connect a motor and an inverter which are mounted in an electric vehicle or a hybrid car. In this example, three conduction paths are included. The conduction path 11 includes an insulative wire core 12 which contains a conductor and a cover made of an insulator, and a terminal 13 which is provided at an end of the insulative wire core 12. The conductor of the embodiment is made of copper, copper alloy, or aluminum. The conductor may be either a conductor structure in which wires are twisted or a rod-like conductor structure whose cross section is a rectangular shape or a round shape (for example, conductor structure with a rectangular single core or a round single core). A bus bar may be used instead of the insulative wire core 12. The terminal of the conduction path 11 is not limited to what is shown in the figure, but may have the structure of a known connector. For example, the terminal of the conduction path 11 is adapted to be inserted into, for example, a hole 16 of a tubular part 15 which is formed on a shield casing 14 (shield structure) of an inverter, which becomes a connection party.

The shield casing 14 is a metal casing member which is conductive, and has such a structure that the inverter can be accommodated inside. The tubular part 15 is formed to be protruded from one side wall 17 of the shield casing 14 for a predetermined length. The tubular part 15 is formed to have an ellipse cross section in this embodiment. A bolt fastening base 19 is formed by being protruded near one side part 18 of the tubular part 15 in the major axis direction. The bolt fastening base 19 is formed in a rectangular block-like shape as shown in the figure, for example. The bolt fastening base 19 has a bolt hole 20 whose axis L1 is parallel to the wall surface of the side wall 17. The tubular part 15 and the bolt fastening base 19 are integrally formed on the side wall 17, and naturally have conductivity.

A reference numeral 21 indicates a shielding member. The shielding member 21 is formed in a tubular shape with which the three conduction paths 11 can be covered collectively. The shielding member 21 is a member for taking electromagnetic wave shielding measures, and is formed so that a substantially overall length of the conduction path 11 can be covered. The shielding member 21 may be formed of a braid 22 (refer to FIGS. 3(a) to 3(e)), or may be formed of a metal foil 23 (refer to FIGS. 4(a) to 4(e)). The material and the shape of the shielding member 21 are not particularly limited as long as the electromagnetic wave shielding measures can be taken and a holding part 25 can be formed at a terminal part 24.

The shielding member 21 is formed in a tubular shape which has an ellipse cross section. The shielding member 21 is so formed that the lengths of the shielding member 21 in the major axis direction and in the minor axis direction are slightly larger than those of the tubular part 15 of the shield casing 14.

The above-mentioned holding part 25 is formed by bending an end 34 to be described later in the terminal part 24 of the shielding member 21 in the direction of an axis L2 of the shielding member 21. In this embodiment, the holding part 25 is formed by bending inwards the end 34 to be described later (alternatively, the holding part 25 may be formed by bending the end 34 outwards). The holding part 25 is formed in a generally two-folded bag-like shape. The holding part 25 has an opening part 27 at one side part 26 in the major axis direction. The opening part 27 is so formed that fixing parts 30 to be described later can be protruded outwards from the inside.

The opening part 27 when the shielding member 21 is formed of the braid 22 (refer to FIGS. 3(a) to 3(e)) is slightly different in formation from that when the shielding member 21 is formed of the metal foil 23 (refer to FIGS. 4(a) to 4(e)).

Figure 3:
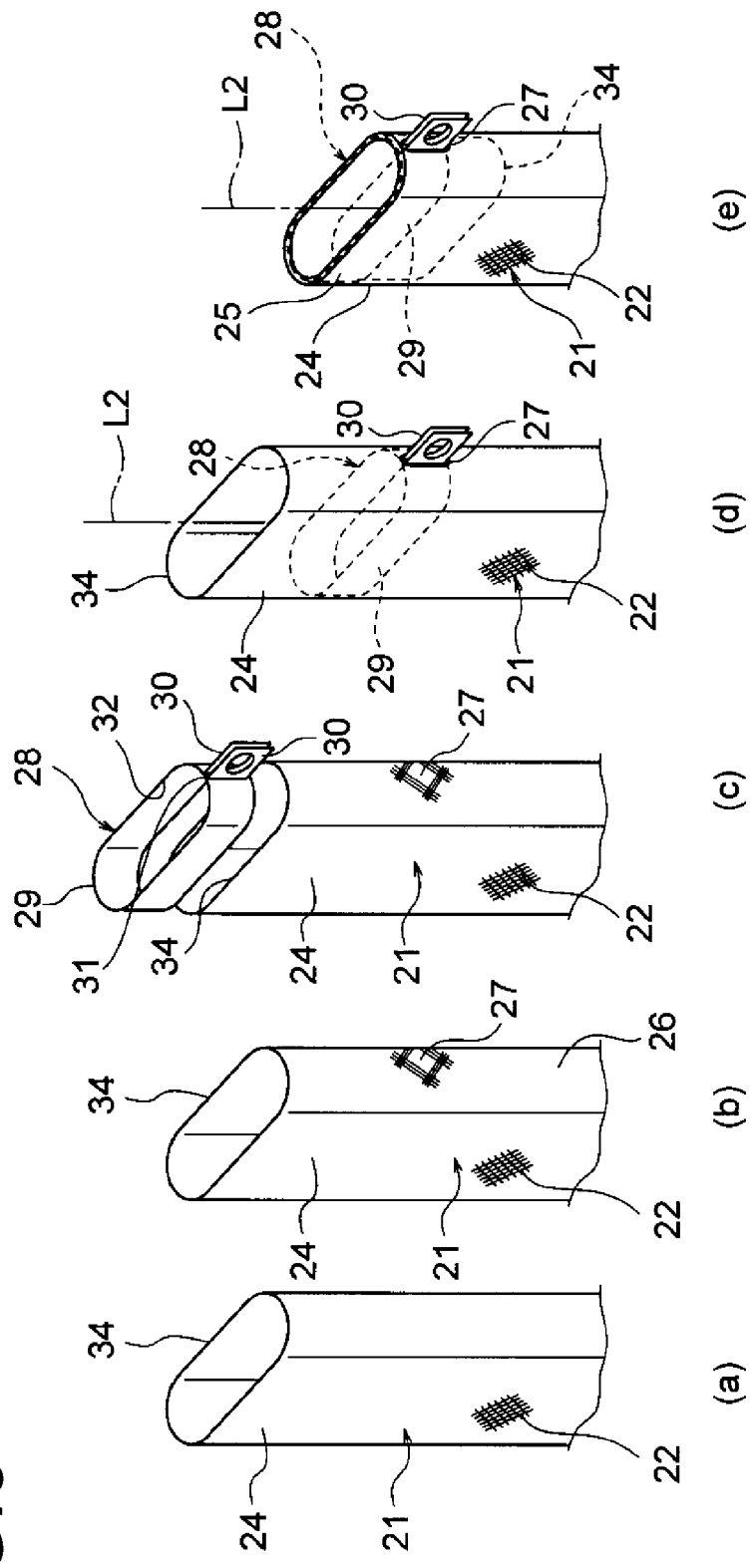
In FIG. 3,(a) to (e) are diagrams which show the process of forming a holding part at the terminal part of the shielding member (braid) and holding a clamping and fixing member.

A reference numeral 28 indicates the clamping and fixing member. The clamping and fixing member 28 is a member which has conductivity, and is formed by forging a thin metal plate with elasticity. In particular, the clamping and fixing member 28 is formed by bending the above-mentioned thin metal plate while the above-mentioned thin metal plate is forged to a belt. The clamping and fixing member 28 has a terminal pressing part 29 and a pair of fixing parts 30. The terminal pressing part 29 is formed in a generally C-shaped form, as shown in FIGS. 3(*c*) and 4(*c*), as if a part of the tube which becomes an ellipse in a cross sectional view is split. A split part 31 is formed to be produced between two terminals of the terminal pressing part 29. The terminal pressing part 29 is formed in such a shape that the length in the minor axis direction is shortened especially, if an interval between the two terminals becomes shorter when the two terminals get closer. The inner surface of the terminal pressing part 29 is formed as a pressing surface 32.

The fixing parts 30 are coupled to the two terminals of the terminal pressing part 29, respectively. The pair of fixing parts 30 are arranged and formed to be opposite to each other at an interval in accordance with the split part 31. The pair of fixing parts 30 have the same rectangular flat plate shape, and have a bolt insertion through-hole 33 where a bolt is inserted in a central position.

Next, terminal processing procedures are described with reference to FIGS. 3(*a*) to 3(*e*). FIGS. 3(*a*) to 3(*e*) are diagrams which show terminal processing procedures when the shielding member 21 is formed of the braid 22.

In a first procedure shown in FIG. 3(*a*), the shielding member 21 is formed of the braid 22 in which very thin wires, which has conductivity, are weaved to a tubular shape. The shielding member 21 is formed by cutting the braid 22 into a predetermined length in the longitudinal direction. In FIG. 3(*a*), with the above-mentioned cutting, the end 34 of the shielding member 21, in other words, the end 34 of the braid 22 is kept in a cut state (no additional processes although it is easy to get loose).

Figure 4:
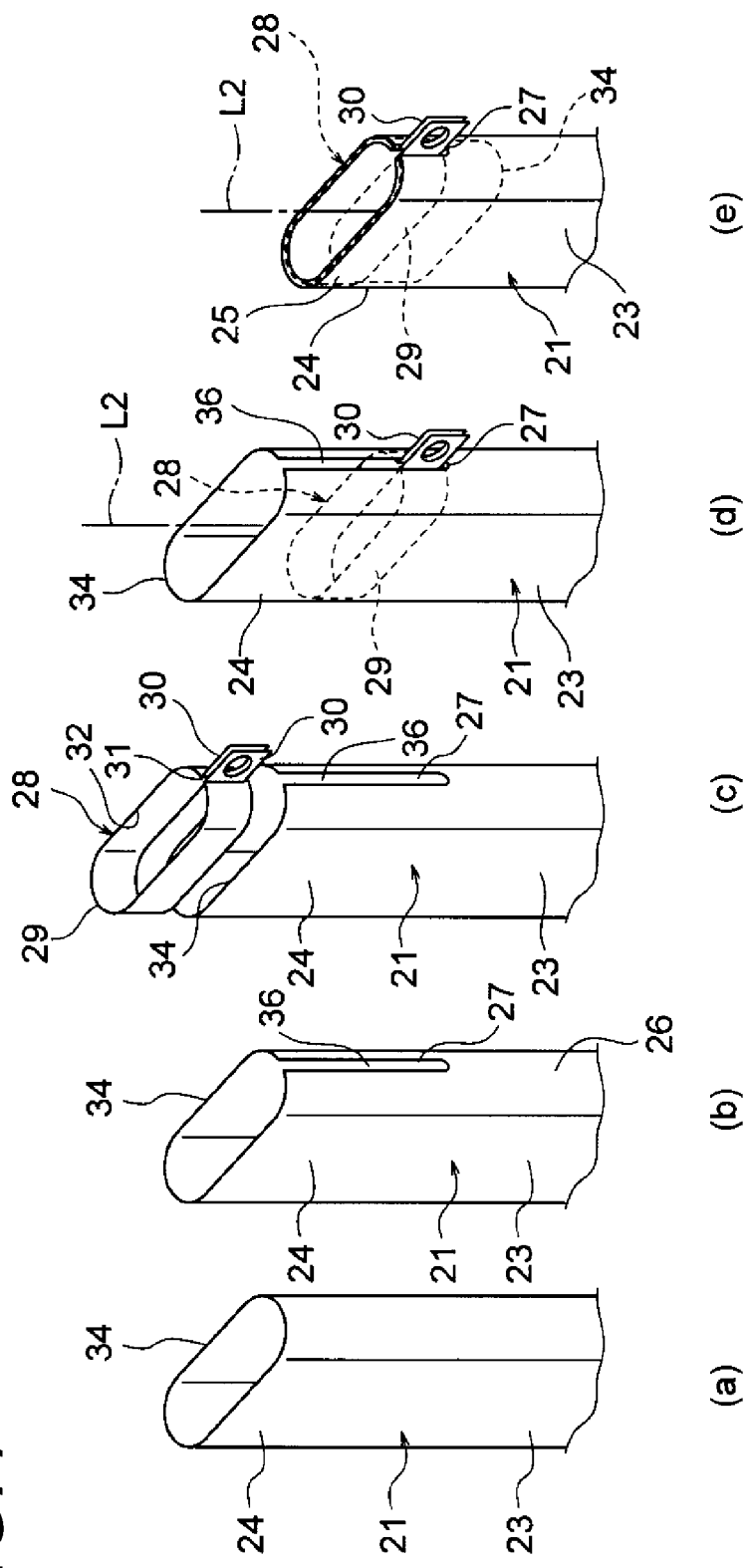
In FIG. 4,(a) to (e) are diagrams which show the process of forming a holding part at the terminal part of the shielding member (metal foil) and holding a clamping and fixing member.

In a second procedure shown in FIG. 3(*b*), the opening part 27 of the shielding member 21 (braid 22) is formed at the side part 26. The opening part 27 is formed by widening a mesh at a predetermined position from the end 34. It is also possible to drill a hole by cutting off to form the opening part 27 besides widening a mesh. It is also possible to form a generally slit-like part (refer to the slit 36 to be described later, which is shown in FIG. 4(*b*)), which is extended from the end 34, by disentangling or cutting meshes, and to form the opening part 27 with this part. The opening part 27 is formed in conformity with the size of the fixing parts 30 in the clamping and fixing member 28.

In a third procedure shown in FIGS. 3(*c*) and 3(*d*), the clamping and fixing member 28 is mounted to the shielding member 21 (braid 22). In particular, the clamping and fixing member 28 is mounted by protruding the fixing parts 30 outwards from the inside of the opening part 27 while the terminal pressing part 29 is inserted inside the shielding member 21.

In a fourth procedure shown in FIG. 3(*e*), the holding part 25 is formed by bending the terminal part 24 of the shielding member 21 (braid 22) inwards to hide the end 34. Since the braid 22 becomes two-folded and generally bag-like with the forming of the holding part 25, and the pair of fixing parts 30 are caught in the opening part 27, the clamping and fixing member 28 is kept in an undropped state. The braid 22 overlaps with the pressing surface 32 of the terminal pressing part 29 with the forming of the holding part 25. After the terminal part 24 is bent inwards, if the terminal part 24 is fixed so that the two-folded part near the end 34 (bag mouth part which is formed at the mouth of the bag when the generally bag-like shape is formed) is partly or totally closed, it will become possible to prevent the dropping of the clamping and fixing member 28 more reliably. The closing methods may include welding such as seam welding or spot welding, contact bonding such as heat contact bonding, and the use of closing members (stapler), which are mentioned as preferable examples.

After the above terminal processing procedures, when the terminal part 24 of the shielding member 21 is inserted to the outside of the tubular part 15 of the shield casing 14, as shown in FIG. 1, and the pair of fixing parts 30, which are placed on the bolt fastening base 19, are clamped and fixed with a bolt 35, as shown in FIG. 2, the terminal part 24 of the shielding member 21 is pressed with the fixing so that the terminal pressing part 29 of the clamping and fixing member 28 is in a surface contact with the tubular part 15. Therefore, at the same time of clamping and fixing with the bolt 35, electric connection of the shielding member 21 is also completed.

Next, terminal processing procedures when the shielding member 21 is formed of the metal foil 23 are described with reference to FIGS. 4(*a*) to 4(*e*).

In a first procedure shown in FIG. 4(*a*), the shielding member 21 is formed by making the metal foil 23 which has conductivity in a tubular form, and cutting into a predetermined length in the longitudinal direction.

In a second procedure shown in FIG. 4(*b*), the opening part 27 of the shielding member 21 (metal foil 23) is formed at the side part 26. The opening part 27 is formed by cutting until a predetermined position from the end 34 (The slit 36 is formed, and a part of the slit 36 becomes the opening part 27. It is also possible to drill a hole by cutting off to form the opening part 27 besides forming the slit 36). The opening part 27 is formed in conformity with the size of the fixing parts 30 in the clamping and fixing member 28.

In a third procedure shown in FIGS. 4(*c*) and 4(*d*), the clamping and fixing member 28 is mounted to the shielding member 21 (metal foil 23). In particular, the clamping and fixing member 28 is mounted by protruding the fixing parts 30 outwards from the inside of the opening part 27 while the terminal pressing part 29 is inserted inside the shielding member 21.

In a fourth procedure shown in FIG. 4(*e*), the holding part 25 is formed by bending the terminal part 24 of the shielding member 21 (metal foil 23) inwards to hide the end 34. Since the metal foil 23 becomes two-folded and generally bag-like with the forming of the holding part 25, and the pair of fixing parts 30 are caught in the opening part 27, the clamping and fixing member 28 is kept in an undropped state. The metal foil 23 overlaps with the pressing surface 32 of the terminal pressing part 29 with the forming of the holding part 25. After the terminal part 24 is bent inwards, if the terminal part 24 is fixed so that the two-folded part near the end 34 (bag mouth part which is formed at the mouth of the bag when the generally bag-like shape is formed) is partly or totally closed, it will become possible to prevent the dropping of the clamping and fixing member 28 more reliably. The closing methods may include adhesion with adhesive and the use of closing members (stapler or tape), which are mentioned as preferable examples.

After the above terminal processing procedures, when the terminal part 24 of the shielding member 21 is inserted to the outside of the tubular part 15 of the shield casing 14, as shown in FIG. 1, and the pair of fixing parts 30, which are placed on the bolt fastening base 19, are clamped and fixed with a bolt 35, as shown in FIG. 2, the terminal part 24 of the shielding member 21 is pressed with the fixing so that the terminal pressing part 29 of the clamping and fixing member 28 is in a surface contact with the tubular part 15. Therefore, at the same time of clamping and fixing with the bolt 35, electric connection of the shielding member 21 is also completed.

Figure 6:
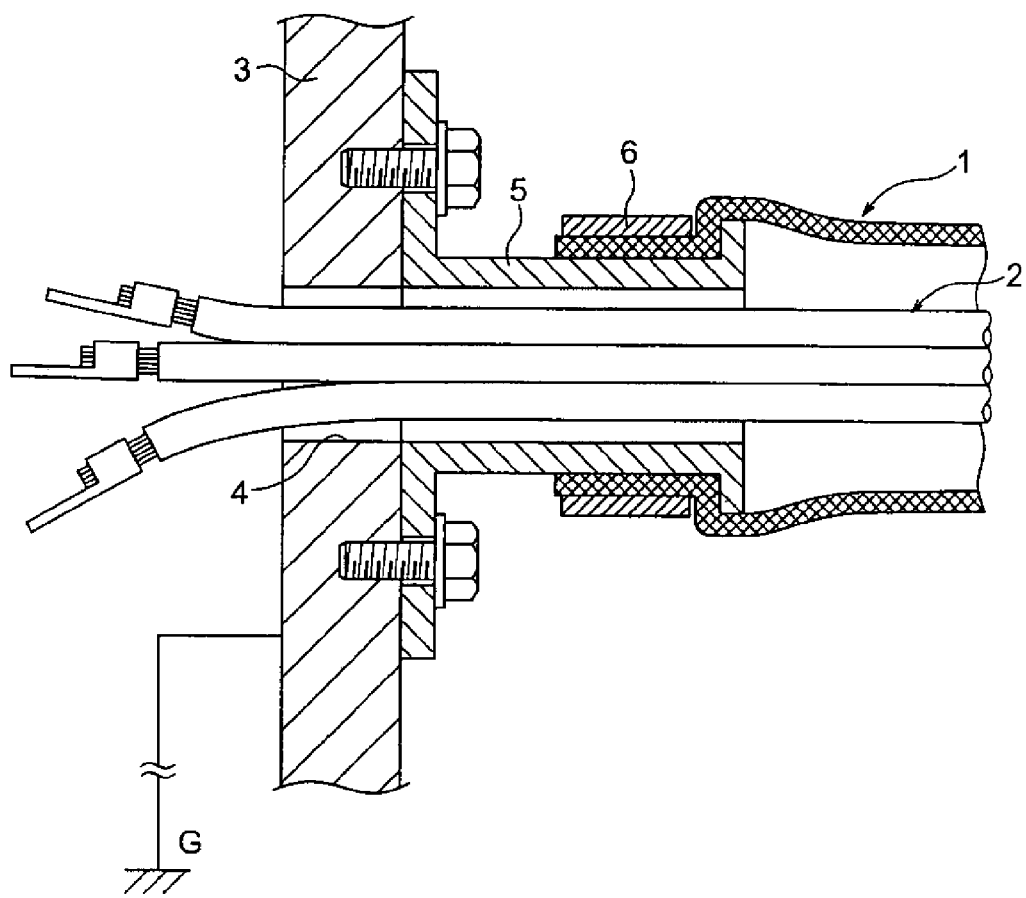
FIG. 6 is a cross sectional view which shows an example of a shield terminal connection structure in a related art.

According to the first embodiment, an effect is achieved that a shield terminal connection structure and a shield terminal connection method which are simple can be provided, in order to connect the terminal part 24 of the shielding member 21 to the shield casing 14. Therefore, an effect is achieved that the problems of the conventional example are solved. That is, in the related art example, as shown in FIG. 6, the terminal part of the braid 1 is inserted into the predetermined position of the shielding shell 5, the shielding shell 5 is pressed with the crimping of the crimp ring 6, and then the shielding shell 5 is fixed to the shield casing 3. Therefore, in the connecting of the braid 1, there is a problem that the connecting is time-consuming, and there is a problem that the number of components is large. However, according to the present invention, it can be found from the description of FIGS. 1 to 4(e), since the shield terminal connection structure and the shield terminal connection method are simple, an effect is achieved that the above-mentioned problems can be solved.

Second Embodiment

Figure 5:
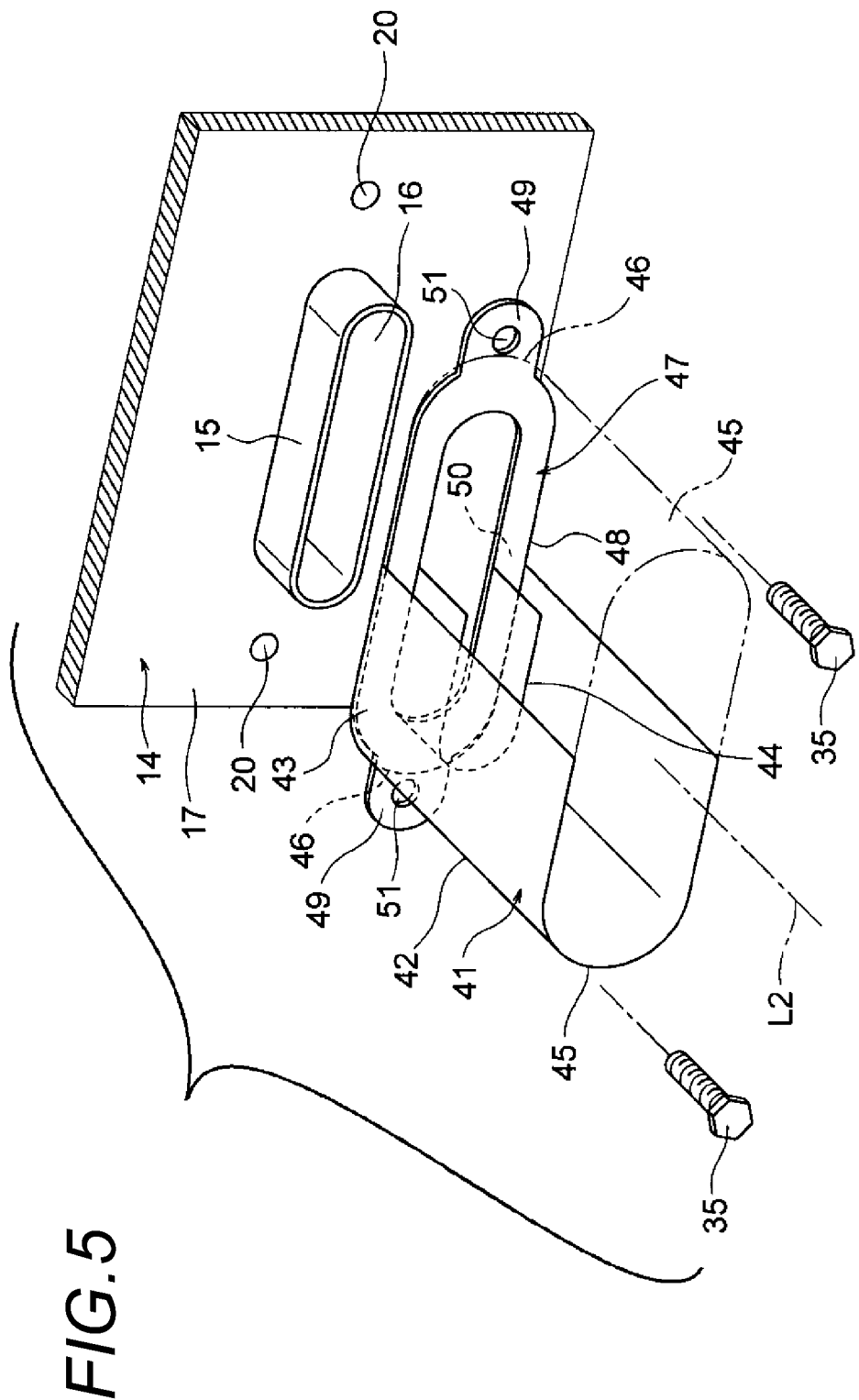
FIG. 5 is a diagram which shows another example of a shield terminal connection structure according to the present invention, and is an exploded perspective view of a terminal part of a shielding member and a shield casing (a second embodiment).

Next, a second embodiment is described with reference to the figures. FIG. 5 is a diagram which shows another example of a shield terminal connection structure according to the present invention, and is an exploded perspective view of a terminal part of a shielding member and a shield casing.

In FIG. 5, a reference numeral 41 indicates a shielding member. The shielding member 41 is formed in a tubular shape with which three conduction paths 11 not shown in the figure (refer to FIG. 1) can be covered collectively. The shielding member 41 is a member for taking electromagnetic wave shielding measures, and is formed so that a substantially overall length of the conduction path 11 can be covered. The shielding member 41 may be formed of a braid, or may be formed of a metal foil. The material and the shape of the shielding member 41 are not particularly limited as long as the electromagnetic wave shielding measures can be taken and a holding part 43 can be formed at a terminal part 42.

The shielding member 41 is formed in a tubular shape which has an ellipse cross section. The shielding member 41 is so formed that the lengths of the shielding member 41 in the major axis direction and in the minor axis direction are slightly larger than those of the tubular part 15 of the shield casing 14. In the second embodiment, the bolt fastening base 19 (refer to FIG. 1) does not exist on the shield casing 14, but bolt holes 20 are separately formed on one side wall 17.

The above-mentioned holding part 43 is formed by bending an end 44 in the terminal part 42 of the shielding member 41 in the direction of an axis L2 of the shielding member 41. In this embodiment, the holding part 43 is formed by bending the end 44 inwards (alternatively, the holding part 43 may be formed by bending the terminal 68 outwards). The holding part 43 is formed in a generally two-folded bag-like shape (similar to the holding part 25 of the first embodiment). The holding part 43 has a pair of opening parts 46 at side parts 45 in the major axis direction. The opening parts 46 are so formed that fixing parts 49 to be described later can be protruded outwards from the inside.

The opening parts 46 when the shielding member 41 is formed of a braid are slightly different in formation from those when the shielding member 41 is formed of a metal foil (formed similarly to the opening part 27 of the first embodiment).

A reference numeral 47 indicates the clamping and fixing member. The clamping and fixing member 47 is a member which has conductivity, and is formed by punching a thin metal plate as shown in the figure. The clamping and fixing member 47 has a terminal pressing part 48 and a pair of fixing parts 49. The terminal pressing part 48 is formed in an annular plate shape which is an ellipse when viewed from top. The inner surface (a surface which faces the shield casing 14) of the terminal pressing part 48 is formed as a pressing surface 50.

The fixing parts 49 are coupled to the two side parts of the terminal pressing part 48 in the major axis direction, respectively. The pair of fixing parts 49 have a bolt insertion through-hole 51 where a bolt is inserted. The pair of fixing parts 49 are arranged and formed in conformity with the positions of the bolt holes 20 of the shield casing 14.

In FIG. 5, the clamping and fixing member 47 is mounted to the shielding member 41. In particular, the clamping and fixing member 47 is mounted by protruding the fixing parts 49 outwards respectively from the inside of the pair of opening parts 46 while the terminal pressing part 48 is inserted inside the shielding member 41.

The holding part 43 is formed by bending the terminal part 42 of the shielding member 41 inwards to hide the end 44. The clamping and fixing member 47 is held in an undropped state with the forming of the holding part 43.

After the above terminal processing procedures, when the terminal part 42 of the shielding member 41 is inserted to the outside of the tubular part 15 of the shield casing 14, and the pair of fixing parts 49 are clamped and fixed with bolts 35, the terminal part 42 of the shielding member 41 is pressed with the fixing so that the terminal pressing part 48 of the clamping and fixing member 47 is in a surface contact with the side wall 17 of the shield casing 14. Therefore, at the same time of clamping and fixing with the bolts 35, electric connection of the shielding member 41 is also completed.

It is needless to say that the same effects as those in the first embodiment are achieved in the second embodiment.

The shield terminal connection structures and methods according to the present invention are described in detail with reference to the specific embodiments, but the invention is not limited to the previously described embodiments, and besides, it is apparent that various modifications can be made without changing the purpose of the invention.

In the above description, the shield structure is the shield casing 14, but the shield structure is not limited to this. For example, the shield structure may be a panel member or the like, which can serve as a ground.

The present application is based on the Japanese patent application (patent application No. 2010-132587) filed on Jun. 10, 2010, the contents of which are incorporated herein by reference.

Industrial Applicability

According to the shield terminal connection structures and methods of the present invention, what is necessary is just to use the clamping and fixing member, when the terminal part of the shielding member is connected to the shield structure. When the fixing part of the clamping and fixing member is fixed to the shield structure, the terminal part of the shielding member is pressed to the shield structure by the terminal pressing part of the clamping and fixing member with this fixing. Thus, an effect is achieved that the simple shield terminal connection structures and methods for connecting the terminal part of the shielding member to the shield structure can be provided.

Reference Signs List

11: conduction path
12: insulative wire core
13: terminal
14: shield casing (shield structure)

15: tubular part
16: hole
17: one side wall
18: one side part
19: bolt fastening base
20: bolt hole
21: shielding member
22: braid
23: metal foil
24: terminal part
25: holding part
26: one side part
27: opening part
28: clamping and fixing member
29: terminal pressing part
30: fixing part
31: split part
32: pressing surface
33: bolt insertion through-hole
34: end
35: bolt
36: slit
41: shielding member
42: terminal part
43: holding part
44: end
45: side part
46: opening part
47: clamping and fixing member
48: terminal pressing part
49: fixing part
50: pressing surface
51: bolt insertion through-hole

The invention claimed is:

1. A shield terminal connection structure, comprising: a terminal part of a tubular shielding member which accommodates a plurality of conduction paths collectively, the terminal part itself forming a holding part; and a clamping and fixing member which is enclosed in and held by the holding part and includes a fixing part and a terminal pressing part which are integrally formed with each other, wherein the fixing part is provided for being fixed with a shield structure of a connection party to which the conduction paths are connected, and the terminal pressing part presses the holding part corresponding to the terminal part to the shield structure in accordance with fixing to the shield structure with the fixing park wherein the holding part comprises an opening for the fixing part of the clamping and fixing member to extend outside the holding part.

2. The shield terminal connection structure according to claim 1, wherein
a pressing surface which presses the holding part by surface contact is formed in the terminal pressing part.

3. The shield terminal connection structure according to claim 1, wherein
the holding part is formed by bending the terminal part in an axial direction of the shielding member, and the clamping and fixing member is enclosed in and held by the holding part so that the fixing part is protruded outwards from the inside of the holding part.

4. The shield terminal connection structure according to claim 3, wherein the terminal part is bent inwards to enclose the clamping and fixing member inside the holding part.

5. The shield terminal connection structure according to claim 3, wherein
the holding part is formed by bending the terminal part in a generally bag-like shape to enclose the clamping and fixing member inside the holding part and fixing the terminal part so that a bag mouth part of the generally bag-like shape is partly or totally closed.

6. The shield terminal connection structure according to claim 4, wherein
the holding part is formed by bending the terminal part in a generally bag-like shape and fixing the terminal part so that a bag mouth part of the generally bag-like shape is partly or totally closed.

7. A shield terminal connection method, comprising:
enclosing a clamping and fixing member by a terminal part of a tubular shielding member which accommodates a plurality of conduction paths collectively and holding the clamping and fixing member by the terminal part, and then, fixing the clamping and fixing member to a shield structure of a connection party to which the conduction paths are connected, via a fixing part of the clamping and fixing member, and pressing the terminal part to the shield structure by a terminal pressing part of the clamping and fixing member, wherein a holding part of the terminal part comprises an opening for the fixing part of the clamping and fixing member to extend outside the holding part.

8. The shield terminal connection structure according to claim 1, wherein the opening of the holding part extends from an edge of the terminal part.

* * * * *